United States Patent
Tekletsadik et al.

(10) Patent No.: US 9,331,476 B2
(45) Date of Patent: May 3, 2016

(54) SOLID STATE FAULT CURRENT LIMITER

(71) Applicant: Varian Semiconductor Equipment Associates, Inc., Gloucester, MA (US)

(72) Inventors: Kasegn D. Tekletsadik, Middleton, MA (US); Charles L. Stanley, Amesbury, MA (US); Semaan Fersan, Hamilton, MA (US); Piotr Lubicki, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 117 days.

(21) Appl. No.: 14/462,121

(22) Filed: Aug. 18, 2014

(65) Prior Publication Data

US 2015/0055263 A1    Feb. 26, 2015

Related U.S. Application Data

(60) Provisional application No. 61/868,712, filed on Aug. 22, 2013.

(51) Int. Cl.
    *H02H 9/08* (2006.01)
    *H02H 9/02* (2006.01)
    *H02H 9/00* (2006.01)
    *H03K 19/20* (2006.01)
    *H02H 9/04* (2006.01)
    *H03K 3/38* (2006.01)

(52) U.S. Cl.
    CPC .............. *H02H 9/021* (2013.01); *H02H 9/005* (2013.01); *H02H 9/02* (2013.01); *H02H 9/023* (2013.01); *H02H 9/041* (2013.01); *H03K 3/38* (2013.01); *H03K 19/20* (2013.01); *Y02E 40/69* (2013.01)

(58) Field of Classification Search
    USPC .............................. 361/19, 93.9; 505/150, 211
    See application file for complete search history.

(56) References Cited

U.S. PATENT DOCUMENTS

| 5,414,586 A * | 5/1995 | Hara .................. H02H 9/023 361/19 |
| 5,892,644 A * | 4/1999 | Evans ................. H01F 6/00 361/19 |
| 2008/0043382 A1 | 2/2008 | Lee et al. |
| 2010/0090755 A1 | 4/2010 | Ng et al. |
| 2011/0116199 A1 | 5/2011 | Darmann |
| 2011/0242711 A1 | 10/2011 | Morgan et al. |
| 2012/0264613 A1 | 10/2012 | Tekletsadik |

OTHER PUBLICATIONS

International Search Report and Written Opinion Mailed Nov. 27, 2014 for PCT/US2014/051675 filed Aug. 19, 2014.

* cited by examiner

*Primary Examiner* — Danny Nguyen

(57) ABSTRACT

A solid-state fault current limiter including a current splitting reactor, comprising a system current input, a passive current output and a control current output. A voltage control reactor includes a first end and a second end, the first end coupled to the control current output and the second end coupled to the passive current output. A fault current trigger circuit coupled in parallel with the voltage control reactor and configured to open when a fault current, received by the system current input, exceeds a predefined trigger current. A transient voltage control circuit coupled in parallel with the voltage control reactor to receive the fault current.

20 Claims, 10 Drawing Sheets

SOLID STATE FAULT CURRENT LIMITER

FIELD

Embodiments described herein relate to current control devices, more particularly, to fault current limiting devices and systems.

BACKGROUND

Fault current limiters (FCLs) are used to provide protection against current surges, for example in power transmission and distribution networks. Various types of FCLs have been developed over the last several decades, including superconducting fault current limiters (SCFCL), inductive fault current limiters, as well as other varieties that are well known in the art. A power system implementing an FCL may include generation, transmission, and distribution networks that generate and deliver power to various industrial, commercial, and/or residential electrical loads.

A fault current is an abnormal current in an electrical system that may result from a fault in the system, such as a short circuit. A fault current may arise in a system due to any number of events or failures, such as power lines or other system components being damaged by severe weather (e.g. lightning strikes). When such a fault occurs, a large load can instantaneously appear in the circuit. In response, the network delivers a large amount of current (i.e. fault current) to the load. This surge of current is unwanted because the surge of current may damage the load, for example, the network itself or equipment connected to the network. A problem with FCL devices is their cost, complexity and size. It is with respect to these and other considerations that the present improvements are provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

The present disclosure provides a solid-state fault current limiter including a current splitting reactor, comprising a system current input, a passive current output and a control current output. A voltage control reactor comprising a first end and a second end, the first end coupled to the control current output and the second end coupled to the passive current output. A fault current trigger circuit coupled in parallel with the voltage control reactor and configured to open when a fault current, received by the system current input, exceeds a predefined trigger current. A transient voltage control circuit coupled in parallel with the voltage control reactor to receive the fault current.

In one embodiment a solid-state fault current limiter is provided having a system current input, a passive current output and a control current output. A voltage control reactor comprising a first end and a second end, the first end coupled to the control current output and the second end coupled to the passive current output. A fault current trigger circuit coupled in parallel with the voltage control reactor and configured to open when a fault current, received by the system current input, exceeds a predefined trigger current. A transient voltage control circuit coupled in parallel with the voltage control reactor to receive the fault current.

In one embodiment a solid-state fault current limiter system is provided having a current splitting device comprising first and second conductive windings wound about a core, wherein the first conductive winding is configured to carry a fault current through both the first winding and the second winding during a fault condition; a voltage control reactor coupled to the current splitting device; a transient voltage control circuit coupled in parallel with the voltage control reactor; and a solid-state fault trigger circuit coupled in parallel with the voltage control reactor. The solid-state fault trigger circuit configured to open when the fault current traveling through the second winding is greater than a predefined threshold current, and the voltage control reactor and the transient overvoltage control are configured to receive the fault current from the second conductive winding when the solid-state fault trigger circuit opens.

In one embodiment, a solid-state fault current limiter system is provided having a current splitting device comprising first and second conductive windings wound about a core. The first conductive winding is configured to carry a fault current through both the first winding and the second winding during a fault condition. A plurality of serially connected voltage control reactor and fault trigger circuit modules may be coupled to the current splitting device, where each one of the plurality of serially connected voltage control reactor and fault trigger circuit modules include a voltage control reactor connected in parallel with a fault trigger circuit.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DESCRIPTION OF EMBODIMENTS

Figure 1:
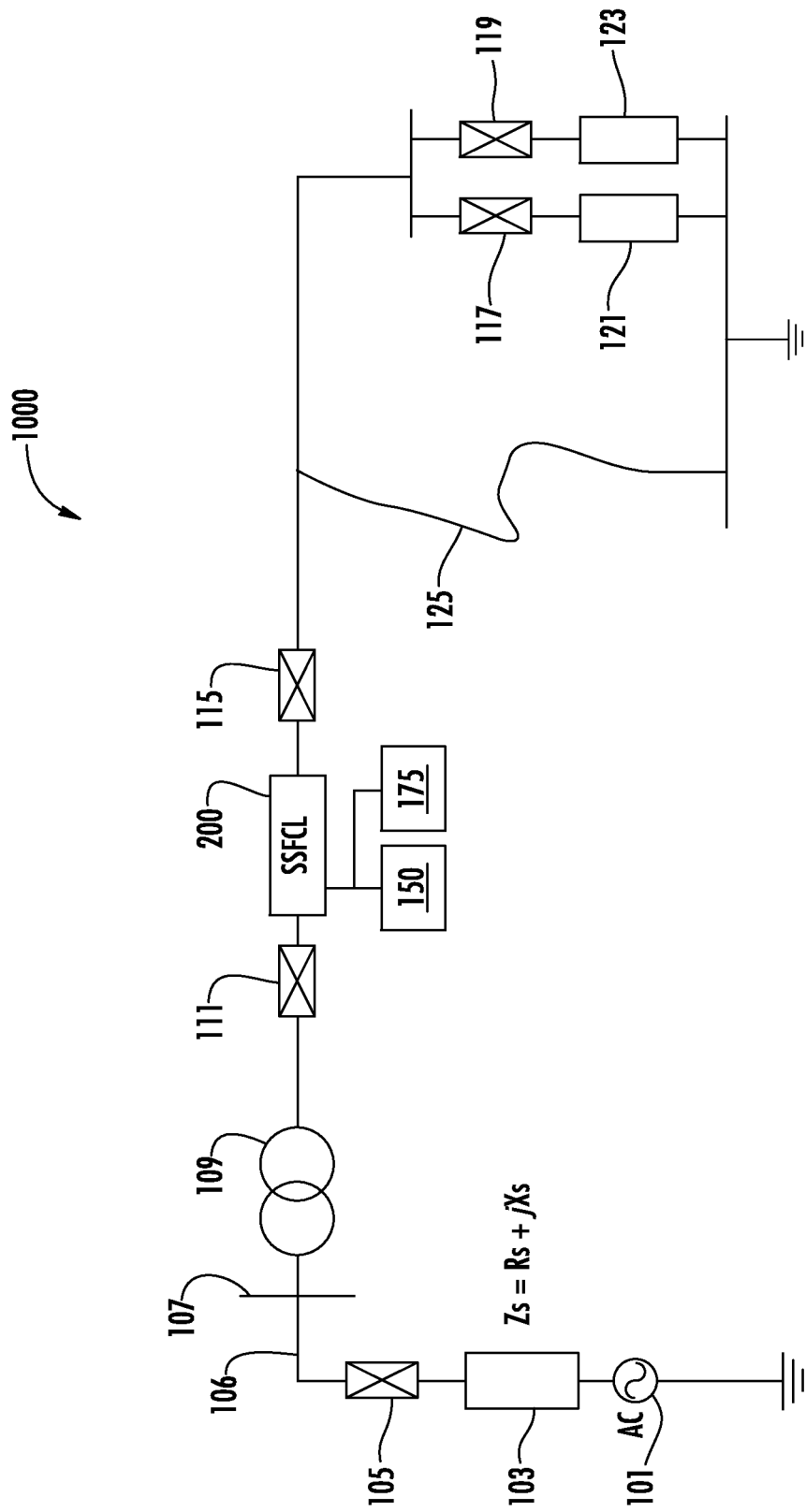
FIG. 1 is an application of a Fault Current Limiter (FCL) in a transmission or distribution system in accordance with an embodiment of the present disclosure.

The present embodiments will now be described more fully hereinafter with reference to the accompanying drawings, in which some embodiments are shown. The present subject matter may be embodied in many different forms and should not be construed as limited to the embodiments set forth herein. These embodiments are provided so that this disclosure will be thorough and complete, and will fully convey the scope of the subject matter to those skilled in the art. In the drawings, like numbers refer to like elements throughout.

Embodiments provide a Solid State Fault Current Limiter ("SSFCL") using a current-splitting mutual reactor design. The SSFCL advantageously is fast to trip and isolate a short-circuit fault as compared to a mechanically-operated fault current limiter. The SSFCL is able to reduce the first cycle peak of a sinusoidal fault current (e.g., a first peak at about 4 to 10 ms for a 60 Hz power supply) by at least 25% to 75%. FIGS. 1-12 illustrate the basic principles of operation of a SSFCL that limits short circuit fault currents in any electrical circuit, such as, transmission, distribution and generation networks.

FIG. 1 illustrates an exemplary Fault Current Limiter system 1000 including a Solid State Fault Current Limiter (SSFCL) 200 that may be implemented in a power transmission and distribution system. A power source 101 supplies power through interface circuit 103 having a complex impedance $Z_s$ comprising a real component $R_s$ and imaginary component $X_s$, and circuit breaker 105. Power transmission line 106 leads to an interface 107 with a substation having a transformer 109 configured to step the transmission line voltage to a voltage compatible with loads 121, 123. Output of transformer 109 may be coupled to circuit breaker 111 and a SSFCL 200. SSFCL 200 may be coupled through circuit breaker 115 and matching circuits 117, 119 to loads 121, 123. Additional loads and matching circuits may be provided. A short circuit fault 125 may exist and, if present, will be isolated by operation of various embodiments described herein.

Figure 2A:
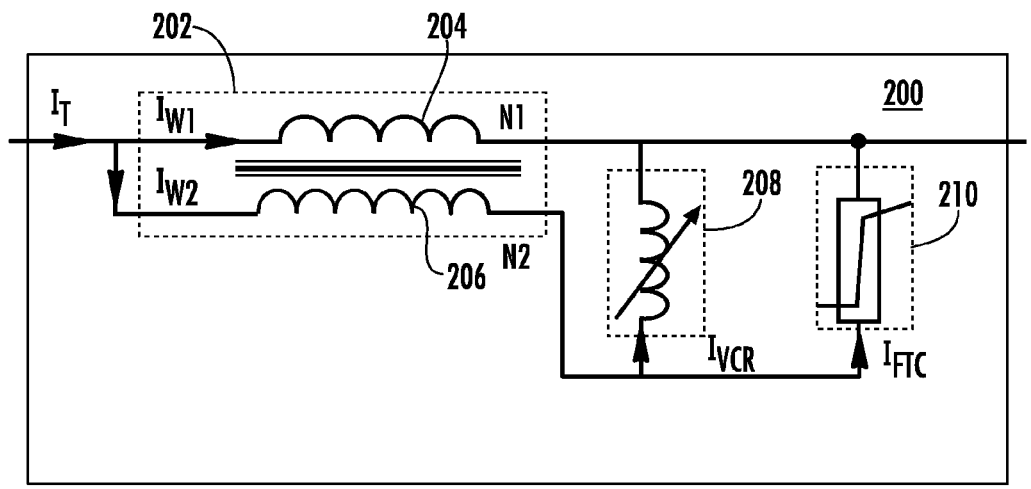
FIG. 2A is an FCL circuit used in a transmission system in accordance with an embodiment of the present disclosure.

FIGS. 2A-10 illustrate various embodiments of a fault current limiter that are usable as SSFCL 200 shown in FIG. 1. In particular, FIG. 2A illustrates SSFCL 200 that includes a current splitting reactor (CSR) 202 and voltage control reactor (VCR) 208 in parallel with Fault Current Trigger (FTC) circuit 210. Turning briefly to FIG. 2A, CSR 202 includes a first conductive winding 204 and a second conductive winding 206 would about a magnetic core 203. Second conductive winding 206 may be counter-wound or wound in a criss-crossed arrangement and each conductive windings, such as the first conductive winding 204 and the second conductive winding 206, may have an equal number of turns. The magnetic core 203 of CSR 202 in SSFCL 200 may preferably correspond to a high permeability material with predictable magnetic properties as a function of increased flux levels in the CSR 202 (See FIG. 2A). The CSR 202 includes the first conductive winding 204 and the second conductive winding 206 that may be configured to exhibit minimal impedance during a steady state operation and comparatively larger impedance during a fault condition to effectively limit the fault current.

Figure 2B:
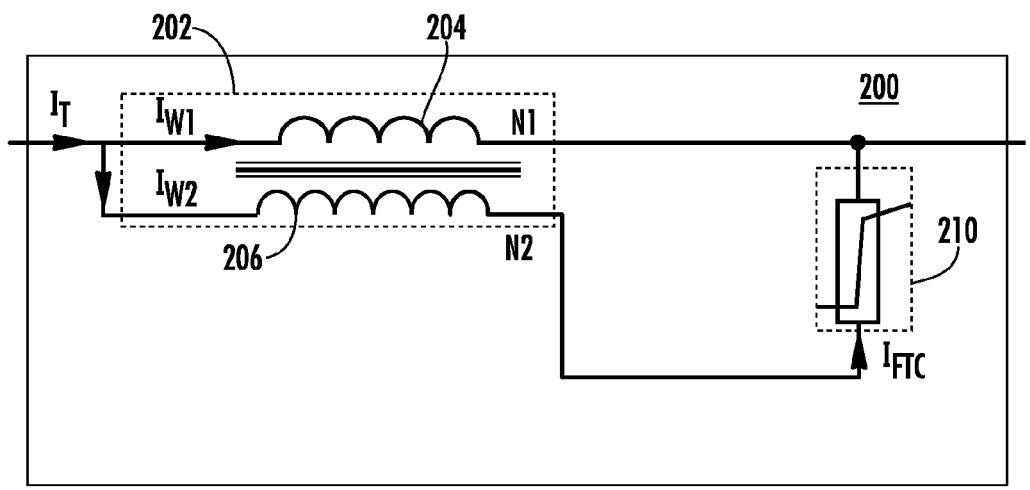
FIG. 2B is FCL circuit used in a transmission system in accordance with an embodiment of the present disclosure.
Figure 2C:
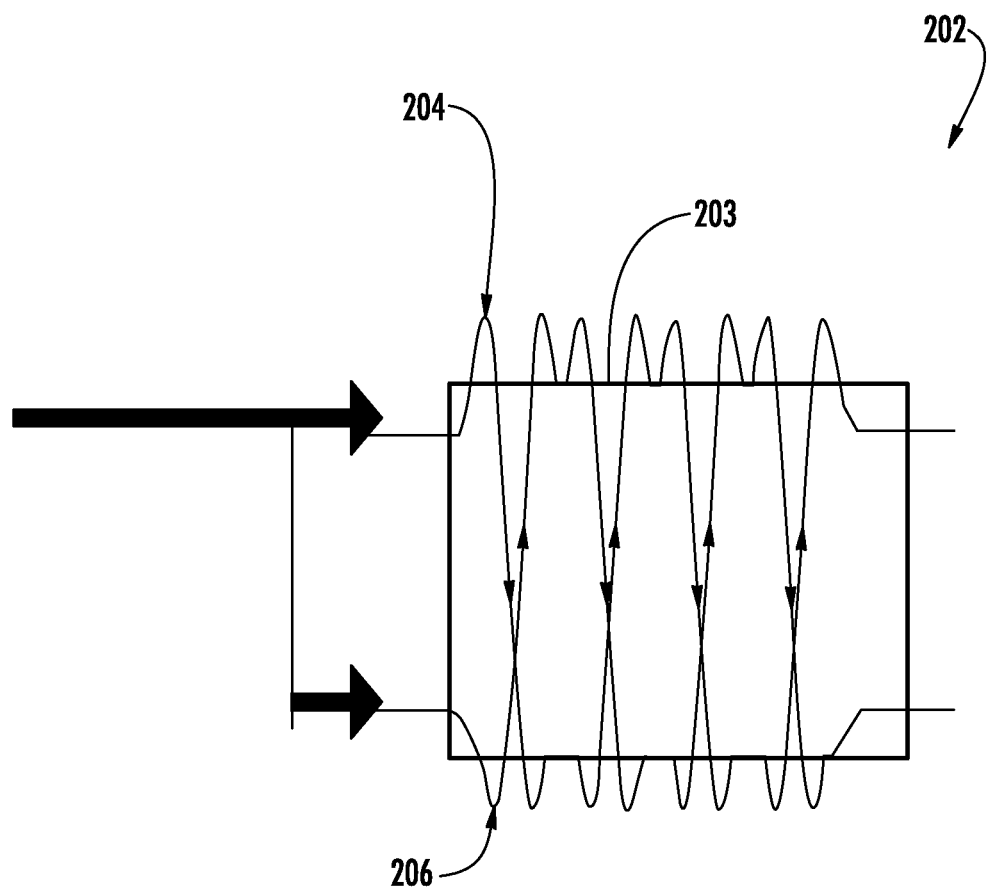
FIG. 2C illustrates a FCL circuit with a first and second winding wound around a core in accordance with an embodiment of the present disclosure.

FIG. 2B illustrates SSFCL 200 that includes a current splitting reactor (CSR) 202 in with Fault Current Trigger (FTC) circuit 210. In FIG. 2B the current splitting reactor (CSR) 202 is used not having the VCR 208 (see FIG. 2A). Turning briefly to FIG. 2B, the CSR 202 includes a first conductive winding 204 and a second conductive winding 206 would about a magnetic core 203. Second conductive winding 206 may be counter-wound or wound in a criss-crossed arrangement and each of the windings, such as the first conductive winding 204 and the second conductive winding 206, may have an equal number of turns. The magnetic core 203 of CSR 202 in SSFCL 200 may preferably correspond to a high permeability material with predictable magnetic properties as a function of increased flux levels in the CSR 202. The CSR 202 includes the first conductive winding 204 and the second conductive winding 206 that may be configured to exhibit minimal impedance during a steady state operation and comparatively larger impedance during a fault condition to effectively limit the fault current. Thus, in one embodiment, the CSR 202 is coupled to FTC 210, and the FTC 210 is configured to open when a fault current, received by a system current input, exceeds a predefined trigger current. A transient voltage control circuit may be coupled to CSR 202.

Returning to FIGS. 2A and 2B, the SSFCL 200 is usable with system currents $I_T$ of about 250 amperes or higher. For example, a current of 4,000 amperes may be protected by the circuit of FIG. 2A with available, appropriately sized components. FTC 210 includes a transient overvoltage control circuit (TOCC) and a switch, as further described below in connection with FIGS. 3A-3C. Under fault conditions, a voltage drop of about 2000 Volts or higher may be accommodated across the FTC 210.

CSR 202 may be used to manage high system currents so that a smaller proportion of the normal/steady state and fault currents flow through the solid state fault current trigger circuit 210. Most solid state devices, such as IGCTs, IGBTs, and diodes, and the like, are rated for lower currents compared to the utility system currents supplied through power transmission line 106. CSR 202 enables SSFCL 200 to be designed using solid state devices, because a smaller portion of the system current $I_T$ flows through FTC 210. Incoming system current $I_T$ is split between a first component $I_{W1}$ that flows through winding 204, and a second component $I_{W2}$ that flows through second conductive winding 206. Current $I_{W2}$ is further split between a current $I_{VCR}$ flowing through VCR 208 and a current $I_{FTC}$ flowing through FTC 210.

In one embodiment, the first conductive winding 204 may be electrically connected in a reverse-parallel relationship with a second conductive winding 206. Current entering the CSR 202 is directed through the first conductive winding 204 in a first direction and through the second conductive winding 206 in a second, opposite direction. In one embodiment, the current flowing through the first conductive winding 204 may therefore be equal to the current flowing through the second conductive winding 206 and, because the first conductive winding 204 and the second conductive winding 206 are arranged in the above-described reverse-parallel configuration, the conductive windings will be magnetically-coupled and will exhibit a negligible net and/or equivalent impedance. The first conductive winding 204 and the second conductive winding 206 may be wound about a core (e.g. magnetic core 203 shown in FIG. 2C), such as, for example, in a bifilar coil arrangement. Other winding arrangements are available for use and may be applied depending on preference and/or technological settings. It is contemplated that the core may be an iron core or an air core having dimensions that are dictated by the current limiting settings of a particular application as will be appreciated by those of ordinary skill in the art.

By using the first conductive winding 204 and the second conductive winding 206 having an appropriate numbers of turns, the steady state operation of the SSFCL 200 may be tailored to distribute steady state current along parallel paths $I_{W1}$ and $I_{W2}$ such that if x % of the steady state current flows along path $I_{W1}$ the remainder (100–x) % of the steady state current flows along path $I_{W2}$. Alternatively, if x % of the steady state current flows along path $I_{W2}$ then the remainder (100–x) % of the steady state current flows along path $I_{W1}$. Thus, during a steady state operation (e.g., steady state condition), the first conductive winding 204 and the second conductive winding 206 of the CSR 202 may be set to distribute the steady state current along parallel paths $I_{W1}$ and $I_{W2}$ in a predefined manner.

In one embodiment, for example, first conductive winding 204 and the second conductive winding 206 may be selected with appropriate numbers of turns for evenly distributing the current in the SSFCL 200 between the paths $I_{W1}$ and $I_{W2}$ such that the current may be distributed so that 50% flows along path $I_{W2}$ and 50% flows along path $I_{W2}$. In other embodiments, the ratio may be set to 40% that flows along path $I_{W2}$ and 60% that flows along path $I_{W1}$; 30% that flows along path $I_{W2}$ and 70% that flows along path $I_{W1}$. In other words, the ratio may be set to 40/60, 30/70, 20/80, for example, along respective paths $I_{W2}$ and $I_{W1}$. In some cases where current distribution is precisely set, an external tuning winding (not shown) can implemented as an optional device.

During the steady state operations of the SSFCL 200, the CSR 202 with counter wound windings, such as the first conductive winding 204 and the second conductive winding 206, cancel the magnetic field inside the core of the current splitting reactor. More specifically, the current splitting device splits the steady state current (e.g., system current $I_T$) into two branches ($I_{W1}$ and $I_{W2}$) that flow through the first conductive winding 204 and the second conductive winding 206 in opposite directions to produce a net zero or negligible magnetic field resulting in a negligible equivalent or net impedance in the circuit. The reactance of the first conductive winding 204 is therefore negated by the oppositely-directed reactance of the second conductive winding 206. Thus, by selecting first conductive winding 204 and the second conductive winding 206 having appropriate numbers of turns, a predetermined portion of steady state current can be routed through the CSR. The steady state current load on the SSFCL 200 is reduced relative to conventional FCL systems. The cost and physical size of the FCL can therefore also be reduced.

Upon the occurrence of a fault condition, the current through the SSFCL 200 suddenly increases where the increased fault current may be measured by a current sensor such as, for example, current sensor 150 shown in FIG. 1. In other words, during the short circuit fault condition, the fault current exceeds the normal steady state current and flows in both winding 204 and winding 206.

Upon receiving a signal output from the current sensor 150 indicating that the fault current exceeds a predefined threshold current level, a controller 175 (as shown in FIG. 1) having at least one processor device and at least one memory device stored therein immediately "trips" the CSR 202. In other words, the controller 175 and current sensor 150 cause the SSFCL 200 to go into a fault state. In particular, when the current in winding 206 exceeds a predefined trigger current (e.g., predefined threshold current), the FTC 210 opens and the fault current transfers to the VCR 208 and the transient overvoltage control circuits (TOCC) (shown as 312, 322, 332, or 342 in FIGS. 3A-3D). When the FTC 210 opens, the impedance of the VCR 208 and the TOCC 312, 322, 332, or 342 becomes high enough to reduce the current through winding 206, thus causing the CSR 202 to lose its magnetic field cancellation and introduces a high current limiting FTC 210 is operable to create an open circuit when FTC 210 receives a signal (e.g., detected from a current sensor) that the fault current exceeds a predetermined threshold current passing through the Fault Current Limiter system 1000. When FTC 210 is open, the current/FTC that had been passing through FTC 210 transfers to $I_{VCR}$ passing through the VCR 208 and the parallel TOCC. The CSR 202 exhibits an equivalent impedance that is great enough to limit the fault current to acceptable peak-to-peak amplitudes to loads 121, 123. In other words, opening the FTC 210 inserts the high impedance of the VCR 208 and the TOCC 312, 322, 332, or 342 into the circuit to reduce the current through second conductive winding 206. (e.g., high impedance meaning a point in a circuit not allowing any current from flowing or allowing a portion of a current), wherein the impedance of the VCR 208 and the TOCC is much greater than the impedance of the second conductive winding 206. During recovery, after the fault is cleared, the FTC 210 is closes and the normal operating condition with low impedance circuit established, Alternatively, a fault current limiting circuit not having CSR 202 would force the fault current limiter to trigger solid state switches in parallel. Such parallel triggering would become very challenging and less reliable due to unbalanced current sharing and related failures. Embodiments in accordance with the present disclosure avoid a circuit design having parallel active fault current trigger circuits. Thus, SSFCL 200 is a very low impedance device and inserts less than 1% of the system impedance during steady state operation. In other words, the SSFCL has less than 1% voltage drop. VCR 208 has negligible current flowing through it. For example if CSR 202 has a 3:1 current ratio between the first conductive winding 204 and the second conductive winding 206, the FTC branch through winding 206 will see 25% of the total current. Other ratios can easily be achieved by modifying the number of turns N1 and N2 in the first conductive winding 204 and the second conductive winding 206, respectively, for the ratio.

FIGS. 3A-3D illustrates Fault Current Sensing Switch (FCSS) circuits 310, 320, 330, and 340, respectively, of the FCSS that may be included as part of FTC 210 shown in FIG. 2A-B. FCSS circuits 310, 320, 330, and 340 may include a variety of types of switches, such as an electromechanical switch, a fast responding variable resistor, a fuse, integrated gate-commutated thyristor (IGCT), insulated gate bipolar transistor (IGBT), vacuum tubes, and so forth. Each FCSS includes a TOCC 312, 322, 332, or 342, also known as a "snubber" circuit. The snubber circuit is a transient overvoltage suppression circuit. The TOCC circuits 312, 322, 332, or 342 are designed to provide efficient and reliable operation as part of FTC 210 by performing one or more different snubbering functions. For example, the snubber circuit suppresses the voltage spikes that are generated across a switch as a result of the switching off of the electrical current as in a switching inverter or chopper circuit having an inductive filter circuit at the output thereof. In particular, the snubber circuit prevents the development of excessive transient voltage peaks across the switching device upon the opening of the switching device and the resultant interruption of current flow through the inductive element of the output filter. The TOCC circuits 312, 322, 332, or 342 prevents damage to the switching device, that may occur when the transient voltage peaks exceed the rated voltage limits of the switching device. The TOCC circuit 312, 322, 332, or 342 may be used to tailor switching trajectory, reduce switching losses, and/or control the effects of parasitic elements in the circuit.

Figure 3A:
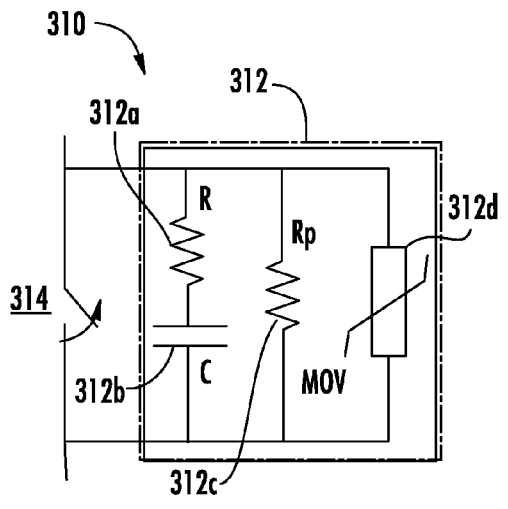
FIG. 3A illustrates a Fault Current Sensing Switch (FCSS) using electromagnetic switches or fuses in accordance with an embodiment of the present disclosure.

FCSS circuit 310 shown in FIG. 3A generally includes a IGCT switch 314 that is an electromechanical switch and a parallel connection of: (a) a series resistance (R) 312a and capacitance (C) 312b; (b) a resistance ($R_p$) 312c; and (c) a metal oxide varistor (MOV) 312d. The TOCC circuit 312 includes relatively high capacitance and resistance values, such that a time constant of >100 µs (i.e., R*C>100 µs) is used for current limiter applications. It is noted that some applications having low trigger current may use a (less than)<100 µs (microseconds) time constant. For example, for brush fire protection the time constant of 20 µs is may be used. Generally, an ideal time constant is (greater than)>10 µs.

Most solid state or power electronic switches such as IGBTs (shown in FIG. 3B) are used for applications where there are low inductances in the circuit. Fault current limiters using power frequencies are usually operated in circuits with high inductances, and when a fault occurs the high product of L×∂i/∂t produces a relatively high transient overvoltage. High inductance circuits such as the generation, transmission and distribution of electric power system use transient overvoltage control circuits such as TOCC 312, 322, 332, or 342 use high values of capacitances and resistances to suppress the transient overvoltage.

Figure 3B:
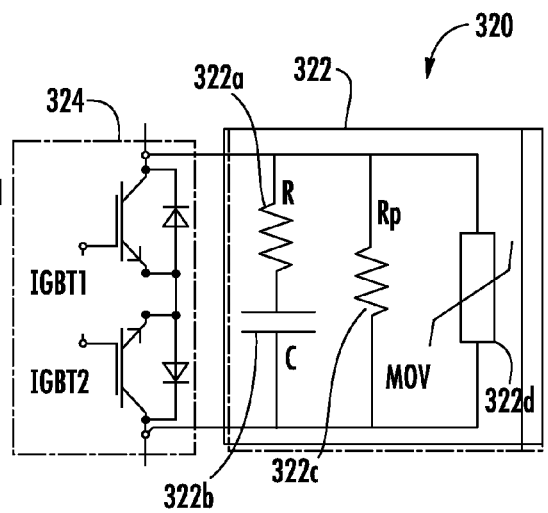
FIG. 3B illustrates an FCSS using IGBT and diodes in accordance with an embodiment of the present disclosure.

The FCSS circuit 320 shown in FIG. 3B includes TOCC 322 in parallel with IGBT switch 324 including IGBT1 and IGBT2. Similar to TOCC 312, TOCC 322 includes a parallel connection of: (a) a series resistance (R) 322a and capacitance (C) 322b; (b) a resistance (Rn) 322c; and (c) a metal oxide varistor (MOV) 322d. Most solid state or power electronic switches such as IGBT1 and IGBT2 are used for applications where there are low inductances in the circuit. Fault current limiters used at power frequencies are usually operated in circuits with high inductances, and when a fault occurs the high product of L×∂i/∂t produces a relatively high transient overvoltage. High inductance circuit applications of SSFCL use an exemplary TOCC with high values of capacitances and resistances to suppress the transient overvoltage.

Figure 3C:
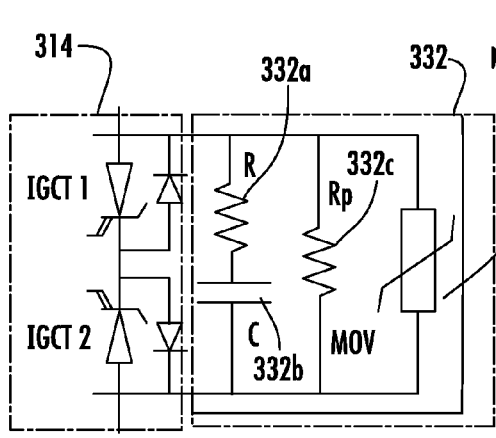
FIG. 3C illustrates an FCSS using IGCT and diodes in accordance with an embodiment of the present disclosure.

FIG. 3C illustrates FCSS circuit 330 including TOCC 332 in parallel with IGCT switch 314 having IGCT1 and IGCT2. Similar to TOCC 312 and 322, TOCC 332 includes a parallel connection of: (a) a series resistance (R) 332a and capacitance (C) 332b; (b) a resistance ($R_p$) 332c; and (c) a metal oxide varistor (MOV) 332d. FCSS circuits 310, 320, 330, and 340 can be used with other types of switches such as a vacuum tube.

Figure 3D:
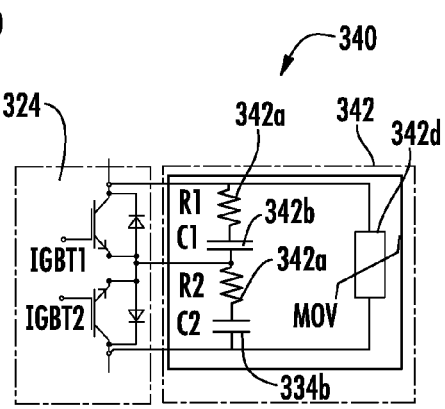
FIG. 3D illustrates FCSS using IGBT and diodes in accordance with an embodiment of the present disclosure.

FIG. 3D illustrates FCSS circuit 340 including TOCC 342 in parallel with IGBT switch 324 including IGBT1 and IGBT2. Similar to TOCC 312, 322, and 332, TOCC 342 includes a connection of: (a) a series resistance (R) 342a and capacitance (C) 342b; and (c) a metal oxide varistor (MOV) 342d. The IGBT switch 324 may be an electromechanical switch. FIG. 3D illustrates that each IGBT switch 314 (IGBT1 and IGBT2), or other switching device, may have a capacitor 343C and a TOCC 312, 322, 332, or 342. The capacitor 343C and the TOCC 312, 322, 332, or 342 may be resistor snubber circuits having with a common or individual metal oxide varistor (MOV) 332d.

Figures 4, 5:
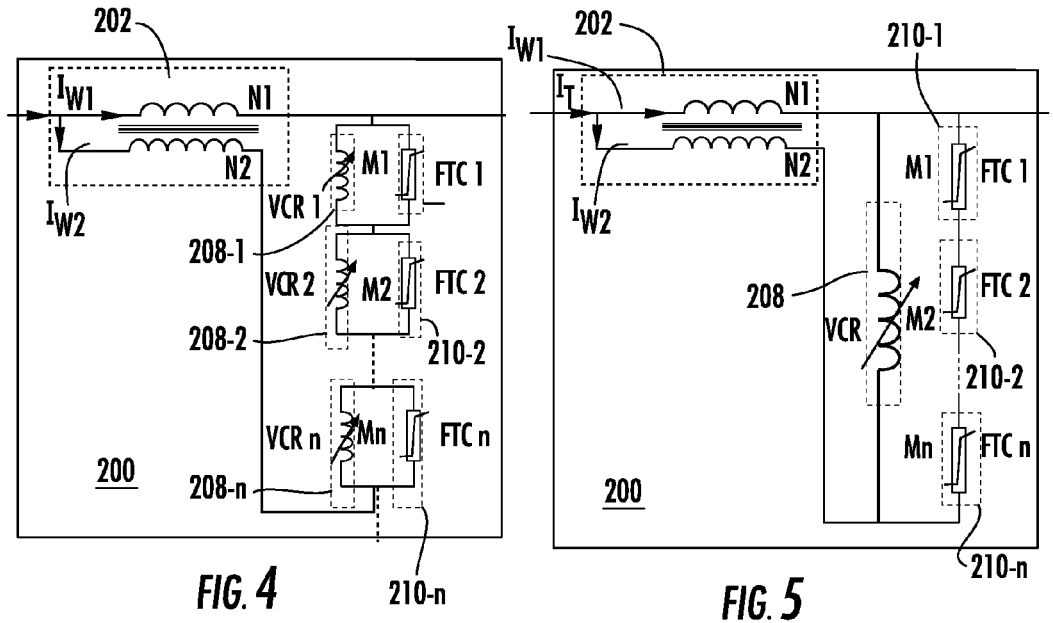
FIG. 4 illustrates an FCL using series connected Voltage Control Reactor (VCR) and Fault Trigger Circuit (FTC) modules in accordance with an embodiment of the present disclosure.
FIG. 5 illustrates an FCL using series connected FTC modules in accordance with an embodiment of the present disclosure.
Figure 6:
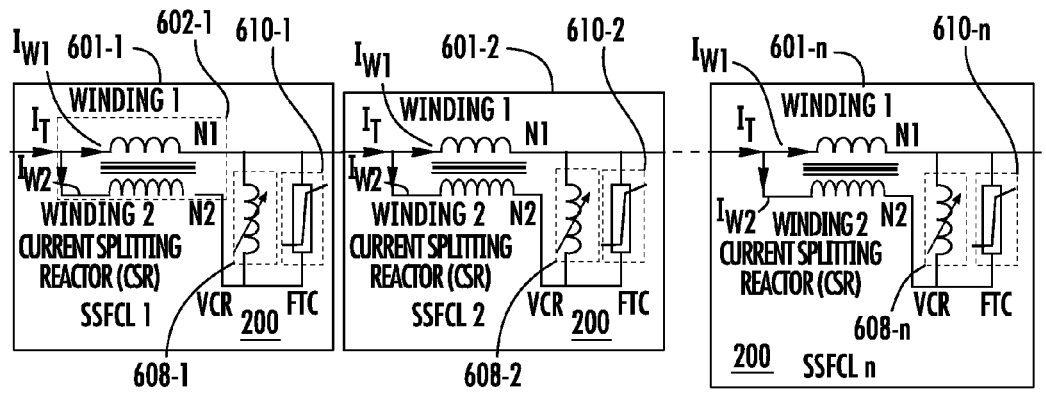
FIG. 6 illustrates a modular FCL using series connected FCL modules in accordance with an embodiment of the present disclosure.

FIGS. 4-6 show various embodiments of fault control circuit 113 that are usable for higher voltage applications. Since the voltage drop across FTC 210 is about 2 KV, additional FTCs may be used in order to provide a fault current limiter circuit that is compatible with a higher voltage.

In particular, SSFCL 200 illustrated in FIG. 4 includes a CSR 202 (as shown in FIG. 2A) and a plurality of VCR and FTC modules M1 . . . Mn connected in series. Each module M1 . . . Mn includes a voltage control reactor (VCR) 208 (shown as 208-1, 208-2 and 208-n) in parallel with a fault trigger circuit (FTC) (shown as 210-1, 210-2 and 210-n). For example, SSFCL module M1 includes VCR 208, shown in FIG. 4 as 208-1 and fault trigger circuit FTC 1 (210-1) connected in parallel. SSFCL Module M2 includes voltage control reactor VCR 2 (208-2) and fault trigger circuit FTC 2 (210-2) connected in parallel. SSFCL Module Mn includes voltage control reactor VCRn (208-n) and fault trigger circuit FTCn (210-n) connected in parallel. The plurality of SSFCL modules M1 . . . Mn are connected in series, and in series with the second conductive winding N2 of the CSR 202. SSFCL 200 of FIG. 4 also provides redundancy if an individual VCR or FTC of modules M1 . . . Mn fails during operation.

FIG. 5 illustrates SSFCL 200 that includes VCR 208 having a relatively large value of inductance, connected in parallel with a plurality of fault trigger circuits FTC1 (210-1), FTC2 (210-2) . . . FTCn (210-n) where each of the FTCs 210-1 . . . 210-n are connected in series, and interconnected as shown in FIG. 5. In this embodiment each of the FTC defines a module M1 . . . Mn. For example, module M1 is defined as FTC1 (210-1). Similarly, module M2 is defined as FTC2 (210-2) and module Mn is defined as FTCn (210-n). In another embodiment (not illustrated in FIG. 5), a plurality of VCRs may be connected in series, and each VCR may be connected in parallel with two or more FTCs.

FIG. 6 illustrates SSFCL 200 of a fault current limiting circuit including a plurality of SSFCL modules 601-1 . . . 601-n connected in series. FIG. 6 illustrates device-level modularity, such that each module 601-1 . . . 601-n includes a CSR 602-1 . . . 602-n and a VCR 608-1 . . . 608-n in parallel with an FTC 610-1 . . . 610-n. For example, module 601-1 comprises CSR 602-1 with winding N11 and winding N21 and VCR 608-1 connected in parallel with FTC 610-1. Similarly, module 601-2 comprises CSR 602-2 with winding N12 and winding N22 and VCR 608-2 connected in parallel with FTC 610-2. Module 601-n comprises CSR 602-n with winding N1n and winding N2n and VCR 608-n connected in parallel with FTC 610-n. As compared to SSFCL 200 shown in FIGS. 4 and 5, SSFCL 200 of FIG. 1 provides greater voltage isolation and independence between SSFCL 200 having SSFCL modules 601-1 . . . 601-n increasing the overall voltage capability. If a fault condition such as short circuit fault 125 (e.g. 125 shown in FIG. 1) were to occur, the FTCs of the SSFCL modules 601-1 . . . 601-n will open, and the fault current will be reduced to an amount equal to a steady state current or a predetermined amount, such as, for example, by 50%.

Figure 7:
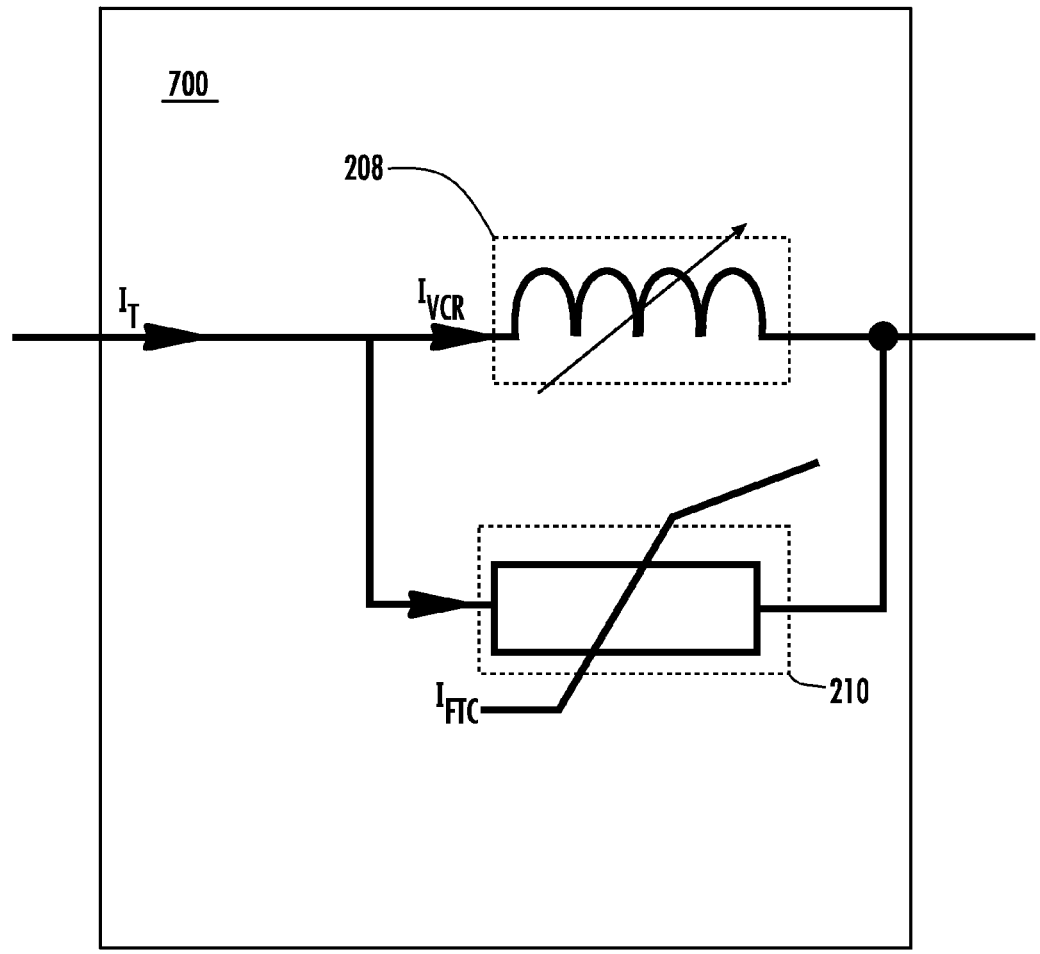
FIG. 7 illustrates an FCL circuit not including a current splitting reactor in accordance with an embodiment of the present disclosure.

FIG. 7 illustrates embodiment 700 of an SSFCL circuit having a load current $I_T$ handled with the VCR 208 and the FTC 210 not interconnecting one or more FTC 210 components in parallel with a current splitting reactor. Embodiment 700 may be usable with a current $I_T$ of, for example, up to about 250 amperes.

Figure 8:
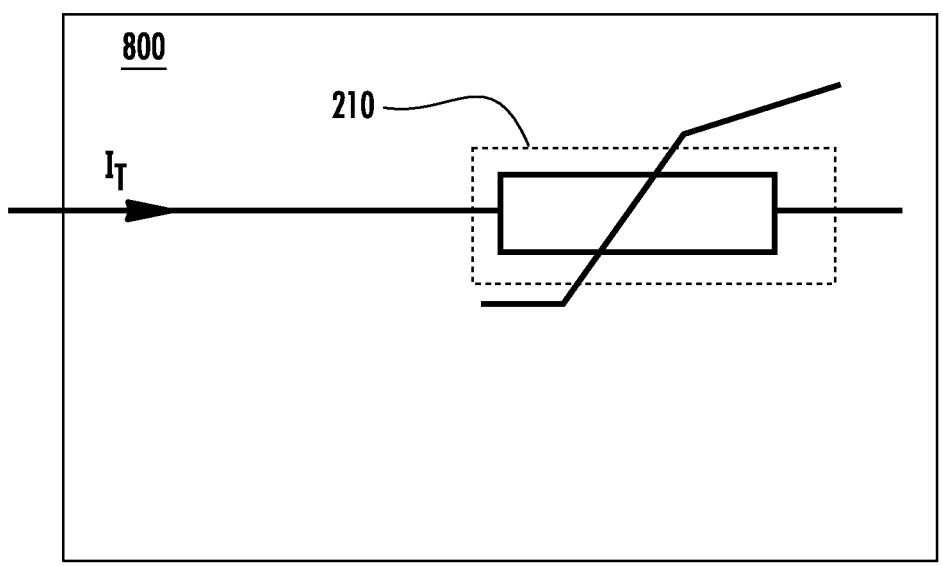
FIG. 8 illustrates an FCL circuit not including a current splitting reactor or a voltage control reactor used in arc flash protection in accordance with an embodiment of the present disclosure.

FIG. 8 illustrates embodiment 800 of an SSFCL circuit having a load current $I_T$ handled with the FTC 210 not interconnecting to either the VCR 208 (see FIG. 2A) or the CSR 202 (see FIG. 2A). The configuration shown in FIG. 8 may be used for arc flash protection in combination with the TOCC 312, 322, 332, or 342, also known as a "snubber" circuit as shown in FIGS. 3A-C. Embodiment 800 may be used in applications with current $I_T$ of up to about 250 amperes.

Figure 9:
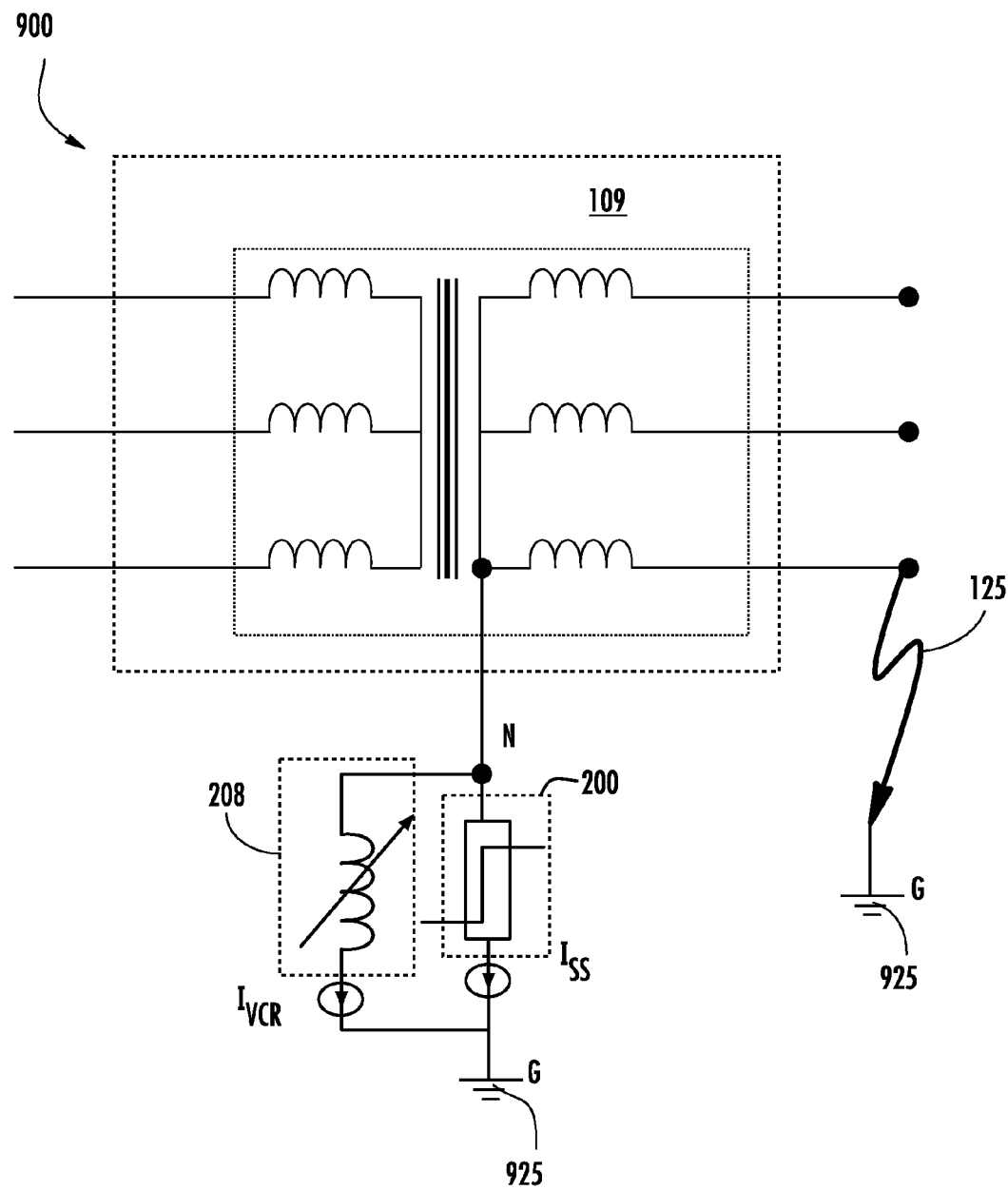
FIG. 9 illustrates an FCL circuit with a voltage control reactor used in a neutral to ground of a transformer to limit phase-to-ground faults in accordance with an embodiment of the present disclosure.

FIG. 9 illustrates a block diagram 900 of an FCL circuit with a voltage control reactor used in a neutral-to-ground of a transformer to limit phase-to-ground faults. This application is suitable for arc flash reduction in accordance with an embodiment of the present disclosure. FIG. 9 illustrates a transformer 109 (see FIG. 1) used in the neutral-to-ground (the ground labeled as "G" 925 and the neutral labeled as "N") in combination with an FCL circuit comprised of VCR 208 and the SSFCL 200. This configuration is used to limit phase-to-ground fault current, such as the short circuit fault 125, with a current $I_{ss}$ ("$I_{ss}$" being the solid state current) from the SSFCL 200 low enough and not interconnecting the FTC (e.g. FTC 210) with the CSR 202 (see FIG. 2). It is noted that arc flash reduction and brush fire protections are some of the applications using the SSFCL 200, and the illustrated embodiments described herein may be used for any fault current limiting.

Figure 10:
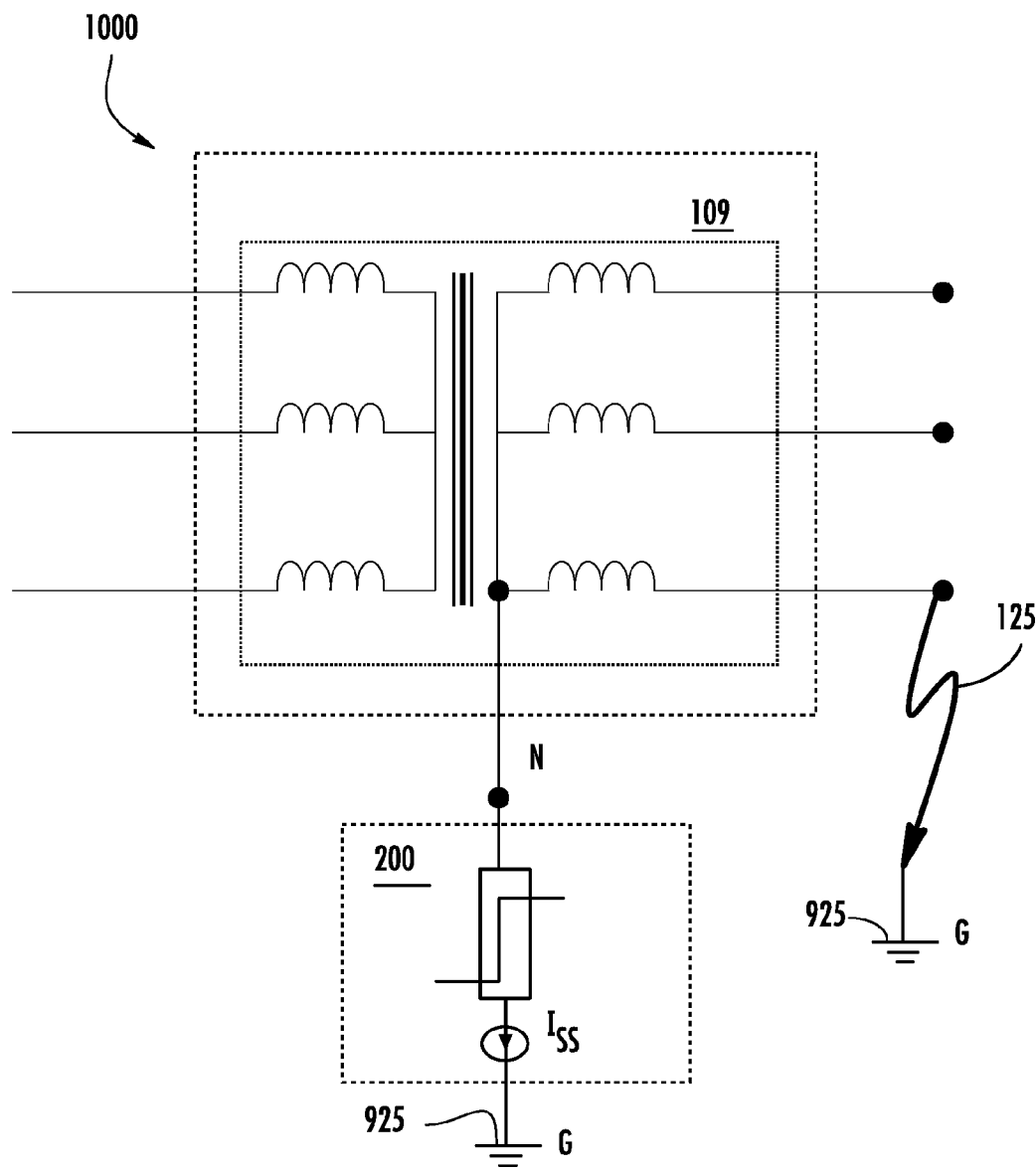
FIG. 10 illustrates an FCL circuit with a voltage control reactor used in a neutral to ground of a transformer to limit phase-to-ground fault where ground fault current needs to be suppressed in accordance with an embodiment of the present disclosure.

FIG. 10 illustrates a Fault Current Limiter system 1000 used as a general FCL circuit for phase to ground faults that includes arc flash reduction. In particular, the Fault Current Limiter system 1000 includes the SSFCL 200 circuit connected to the neutral-to-ground (the ground labeled as "G" 925 and the neutral labeled as "N") of the transformer 109 (see FIG. 1) on one side and to the ground 925 on the other side. The SSFCL 200 to suppress phase-to-ground fault current, such as the short circuit fault 125, for brush fire protection with a solid state current $I_{ss}$ low enough to be handled with the SSFCL 200. The SSFCL 200 configured in the neutral to ground of the transformer 109 is used where the ground fault current needs to be suppressed to very low currents such as, for example, in brush fire protection applications.

Figure 11:
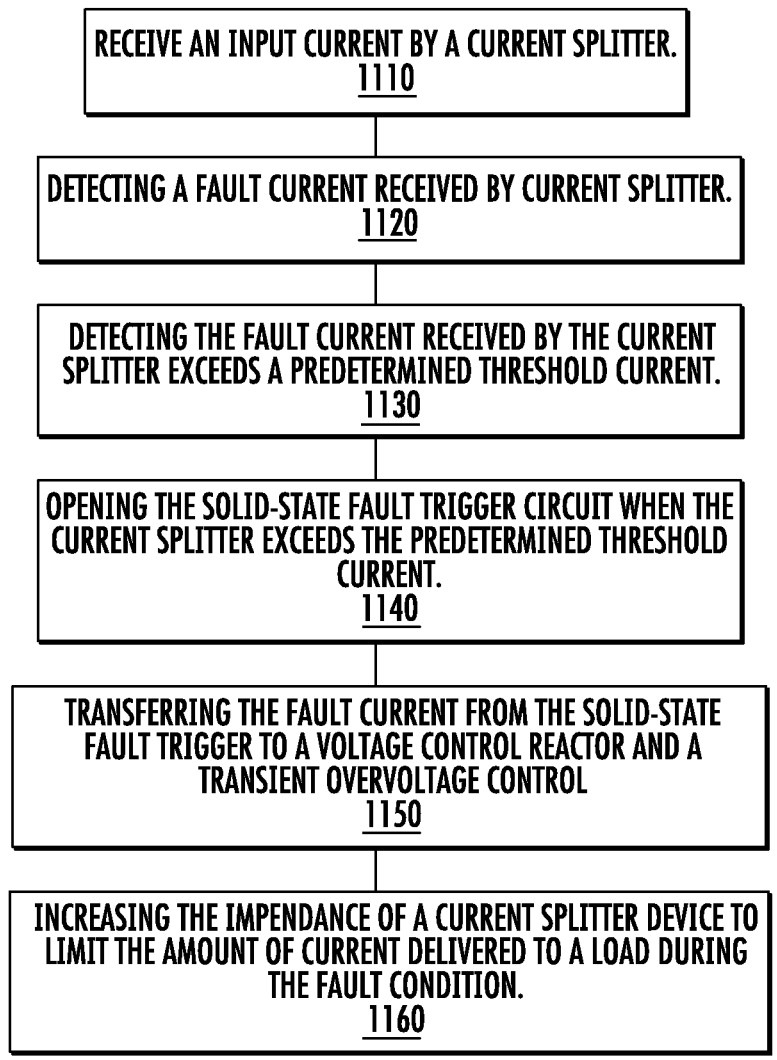
FIG. 11 illustrates a method of operation of a solid-state fault current limiter system in accordance with an embodiment of the present disclosure.

FIG. 11 illustrates flowchart 1100 for a method of operation of a solid-state fault current limiter system. During steady state operation, the CSR 202, having the first conductive winding 204 and the second conductive winding 206 (that may be counter wound windings) receives an input current at 1110. The first conductive winding 204 and the second conductive winding 206 have a magnetic field inside the core of the current splitting reactor 202. During a short circuit fault condition, a fault current is detected at 1120 by the CSR 202. The CSR 202 detects that the fault current is greater than the normal current (e.g., a steady state current) flowing in both the first conductive winding 204 and the second conductive winding 206 at 1120. More specifically, at 1130, the CSR 202 detects the second conductive winding 206 to exceed a predefined threshold/trigger current. The FTC 210 opens, at 1140, and the fault current transfers to the VCR 209 and the transient overvoltage control circuits (TOCC) at 1150. The TOCC may be parallel-connected with the CSR 202 or with VCR 208 (embodiments shown in FIGS. 3A-3C). When the FTC 210 opens, the impedance of the VCR 208 and the TOCC increases at 1160 to reduce the current through the second conductive winding 206, thus causing the CSR 202 to lose its magnetic field cancellation and introduces a high current limiting reactance. The magnetic field cancellation and introduction of a high current limiting reactance in the CSR limits the amount of current delivered to the load during the fault condition.

In summary, the present embodiments provides a current protection system providing fault protection using mechanical protection device that provides a benefit over other electronic protection circuits that may be more complex and costly. For example, the solid-state fault current limiter system of the present disclosure may provide for a reduction of arc flash energy for circuit breakers and the corresponding safety benefits that come with operating and handling lower arc flash energy. This may be useful as a permanently installed fault protection device or as a portable fault protection device. For example, as a portable device it may be used as a safety device for personnel working in switchgear areas where the use of this device reduces the potential current. Furthermore, the solid-state fault current limiter system may be used for in low and high current applications. Reducing the arc energy can also reduce fire hazards due to electrical short circuit faults. This application benefits electric utilities subjected to fire hazards due to electric fires. Also, using a current splitting reactor enables using a solid state fault current limiter for solving problems associated with high current through solid state switches that provides a benefit over other electronic protection circuits that may be more complex and costly.

Thus, as described herein, the various embodiments provide a solid-state fault current limiter system. The solid-state fault current limiter includes a current splitting reactor, comprising a system current input, a passive current output and a control current output, a voltage control reactor comprising a first end and a second end, the first end coupled to the control current output and the second end coupled to the passive current output, and a fault trigger circuit coupled in parallel with the voltage control reactor. The fault current trigger circuit is configured to open when a fault current, received by the system current input, exceeds a predefined trigger current. The solid-state fault current limiter also includes a transient voltage control circuit coupled in parallel with the voltage control reactor configured to receive the fault current.

The current splitting reactor further comprises a first circuit and a second circuit, the first circuit and second circuit being magnetically coupled during a steady state operation condition and magnetically decoupled during a fault condition to limit an amount of current delivered to a load, and configured to enable a limited portion of a current and fault current to flow through the fault trigger circuit. The first circuit comprises a first conductive winding wound about a core and the second circuit comprises a second conductive winding wound about the core, the second winding may be counter wound in respect to the first winding. The first conductive winding is configured to carry a current (e.g., a normal operating current) in a first direction and the second conductive winding is configured to carry a current in a second direction opposite to the first direction such that a first magnetic field associated the first conductive winding is coupled with a second magnetic field of the second conductive winding during steady state operation of the solid-state fault current limiter system. The current splitting reactor is configured to carry the fault current through both the first conductive winding and the second conductive winding during a fault condition. The current splitting reactor is configured to transfer the fault current to the voltage control reactor and the transient overvoltage control circuit in response to the fault trigger circuit opening.

The voltage control reactor and the transient overvoltage control circuit are configured to increase impedance in response to the fault trigger circuit opening, and the current splitting reactor configured to provide current limiting reactance in response to the increase in impedance. The transient voltage control circuit further comprises a parallel connection of a series resistance and capacitance (RC) circuit, and a resistance.

In view of the above-described configuration of the SSFCL 200, with the current the CSR 202 handling a significant portion of the steady state current in the SSFCL 200, the SSFCL 200 may be sized to handle much less steady state current. Material and labor costs may therefore be reduced. The physical size of the FCL may also be reduced, enabling it to be installed in locations that may otherwise have been difficult, if not impractical. In addition, electromagnetic forces and their effects could also be reduced due to less active SSFCL 200 components. The amount of energy dissipated in the SSFCL 200 may also be reduced.

While the present subject matter has been disclosed with reference to certain embodiments, numerous modifications, alterations and changes to the described embodiments are possible, without departing from the sphere subject matter as defined in the appended claims. Accordingly, it is intended that the subject matter of this disclosure not be limited to the described embodiments, but that it has the full scope defined by the language of the following claims, and equivalents thereof.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed is:

1. A solid-state fault current limiter, comprising:
a current splitting reactor, comprising a system current input, a passive current output and a control current output;
a voltage control reactor comprising a first end and a second end, the first end coupled to the control current output and the second end coupled to the passive current output;
a fault trigger circuit coupled in parallel with the voltage control reactor, wherein the fault trigger circuit is configured to open when a fault current, received by the system current input, exceeds a predefined trigger current; and
a transient voltage control circuit coupled in parallel with the voltage control reactor configured to receive the fault current.

2. The solid-state fault current limiter of claim 1, wherein the current splitting reactor further comprises a first circuit and a second circuit, the first circuit and second circuit being magnetically coupled during a steady state operation condition and magnetically decoupled during a fault condition to limit an amount of current delivered to a load, and configured to enable a portion of a steady state current and fault current to flow through the fault trigger circuit.

3. The solid-state fault current limiter of claim 2, wherein the first circuit comprises a first conductive winding wound about a core and the second circuit comprises a second conductive winding wound about the core, the second winding is counter wound in respect to the first winding.

4. The solid-state fault current limiter of claim 3, wherein the first conductive winding is configured to carry current in a first direction and the second conductive winding is configured to carry current in a second direction opposite to the first direction such that a first magnetic field associated the first conductive winding is coupled with a second magnetic field of the second conductive winding during the steady state operation condition.

5. The solid-state fault current limiter of claim 4, wherein the current splitting reactor is configured to carry the fault current through both the first conductive winding and the second conductive winding during a fault condition.

6. The solid-state fault current limiter of claim 5, wherein the current splitting reactor is configured to transfer the fault current to the voltage control reactor and the transient voltage control circuit in response to the fault trigger circuit opening.

7. The solid-state fault current limiter of claim 6, wherein the voltage control reactor and the transient voltage control circuit are configured to increase impedance in response to the fault trigger circuit opening, and the current splitting reactor configured to provide current limiting reactance in response to the increase in impedance.

8. The solid-state fault current limiter of claim 7, wherein the transient voltage control circuit further comprises a parallel connection of a series resistance and capacitance (RC) circuit, and a resistance.

9. A solid-state fault current limiter system comprising:
a current splitting device comprising first and second conductive windings wound about a core, wherein the first conductive winding is configured to carry a fault current through both the first winding and the second winding during a fault condition;
a voltage control reactor coupled to the current splitting device;
a transient voltage control circuit coupled in parallel with the voltage control reactor; and
a solid-state fault trigger circuit coupled in parallel with the voltage control reactor, wherein the solid-state fault trigger circuit configured to open when the fault current traveling through the second winding is greater than a predefined threshold current, and the voltage control reactor and the transient voltage control circuit are configured to receive the fault current from the second conductive winding when the solid-state fault trigger circuit opens.

10. The solid-state fault current limiter of claim 9, wherein the first and second conductive windings magnetically coupled during a steady state operation condition and configured to enable a portion of a steady state current and the fault current to flow through the fault trigger circuit.

11. The solid-state fault current limiter of claim 9, wherein the first conductive winding is configured to carry current in a first direction and the second conductive winding is configured to carry current in a second direction opposite to the first direction such that a first magnetic field associated the first conductive winding is coupled with a second magnetic field of the second conductive winding during steady state operation of the solid-state fault current limiter system.

12. The solid-state fault current limiter of claim 9, wherein the solid-state fault trigger circuit is configured to open in response to receiving a signal that the fault current exceeds the predefined threshold current.

13. The solid-state fault current limiter of claim 9, wherein, in response to the solid-state fault trigger circuit being opened, the voltage control reactor and the transient voltage control circuit configured to increase impedance.

14. The solid-state fault current limiter of claim 9, wherein the first and second windings of the current splitting device are configured to magnetically decouple during the fault condition to limit an amount of current delivered to a load.

15. The solid-state fault current limiter of claim 14, wherein the first and second windings of the current splitting device are configured to increase an equivalent impedance of the current splitting device to limit the amount of current delivered to the load during the fault condition.

16. A solid-state fault current limiter system comprising:
a current splitting device comprising first and second conductive windings wound about a core, wherein the first conductive winding is configured to carry a fault current through both the first winding and the second winding during a fault condition; and
a plurality of serially connected voltage control reactor and fault trigger circuits coupled to the current splitting device, wherein each one of the plurality of serially connected voltage control reactor and fault trigger circuits include a voltage control reactor connected in parallel with a fault trigger circuit.

17. The solid-state fault current limiter system of claim 16, wherein the plurality of serially connected voltage control reactor and fault trigger circuits are connected in series with the second winding of the current splitting device.

18. The solid-state fault current limiter system of claim 16, wherein each fault trigger circuit is configured to open in response to receiving a signal that the fault current traveling through the second winding exceeds a predefined threshold current.

19. The solid-state fault current limiter system of claim 16, further comprises at least one transient voltage control circuit coupled in parallel with the plurality of serially connected voltage control reactor and fault trigger circuits, wherein the first and second windings of the current splitting device are configured to magnetically decouple during the fault condition.

20. The solid-state fault current limiter of claim 14, wherein the first and second windings of the current splitting device are configured to increase an equivalent impedance of the current splitting device to limit the amount of current delivered to the load during the fault condition.

* * * * *